United States Patent [19]

Sugiyama et al.

[11] Patent Number: 4,912,451

[45] Date of Patent: Mar. 27, 1990

[54] HETEROJUNCTION MAGNETIC FIELD SENSOR

[75] Inventors: Yoshinobu Sugiyama, Tsukuba; Munecazu Tacano; Hajime Soga, both of Tsuchiura, all of Japan

[73] Assignees: Nippon Soken, Inc., Nishio; Director-General of Agency of Industrial Science and Technology, Tokyo, both of Japan

[21] Appl. No.: 291,649

[22] Filed: Dec. 29, 1988

[30] Foreign Application Priority Data

Mar. 28, 1988 [JP] Japan .................................. 63-73975
Oct. 3, 1988 [JP] Japan ................................ 63-249544

[51] Int. Cl.$^4$ ............................................ H01L 43/00
[52] U.S. Cl. .................................. 338/32 R; 324/252
[58] Field of Search .......................... 338/32 R, 32 H; 329/200

[56] References Cited

U.S. PATENT DOCUMENTS 4,827,218 5/1989 Meunier et al. .................. 338/32 R

FOREIGN PATENT DOCUMENTS 63-54785 3/1988 Japan .

OTHER PUBLICATIONS

English Abstract of Japanese Unexamined Patent Publication 63-54785, Mar. 1988.
"AlGaAs/GaAs Hetero-Junction Hall Device", Taguchi et al., Journal of the Electronics and Communication Institute, vol. 170-C, No. 5, pp. 758-763, 5/1987.
Electronics and Communications in Japan, Part II: Electronics, vol. 71, No. 3, Mar. 1988, AlGaAs/GaAs Heterojunction Hall Device, Taguchi et al., pp. 110-116.
Molecular Beam Epitaxy 1988, "Highly-Sensitive Hall Element with Quantum-Well Superlattice Structures", Sugiyama et al., pp. 552-555, Workbook of the Fifth International Conference on Molecular Beam Epitaxy, (Aug. 28-Sep. 1, 1988).
"Al.Ga.As/Ga.As Hetero-Junction Hall Device", (Nov., 1985), A Memo of the General Session of the Semiconductor and its Material Dept. in Electro Communication Institute held in 1985.
"Enhanced Hall Output in AlAs/GaAs Superlattice Hall Device with Quantum-Well Spacer", The Technical Research Report of Electro-Information Communication Institute, (Feb. 15, 1988).

Primary Examiner—Teresa J. Walberg
Assistant Examiner—M. Lateef
Attorney, Agent, or Firm—Cushman, Darby & Cushman

[57] ABSTRACT

The heterojunction magnetic field sensor is basically a heterojunction structure forming a two-dimensional electron gas layer having a high carrier mobility at the junction portion of at least two different kinds of semiconductor layers having a different band gap, respectively, and further, at least one semiconductor layer having a quantum well structure is provided adjacent to and in contact with the two dimensional electron gas layer, the energy level of the ground state subband thereof being higher than that of the two-dimensional electron gas layer. This heterojunction magnetic field sensor has a high sensitivity which is not saturated even under a high electric field and provides an enhanced output even under the high electric field.

14 Claims, 17 Drawing Sheets

5a; SEMICONDUCTOR LAYER
5b; CARRIER SUPPLYING LAYER
6; 2DEG LAYER

HETEROJUNCTION MAGNETIC FIELD SENSOR

BACKGROUND OF THE INVENTION

1. Field of the Invention

This invention relates to a magnetic sensor which can be used for various measurements and controls in the electrical and mechanical industries.

2. Description of the Related Arts

In the construction of a known heterojunction magnetic field sensor, a two-dimensional electron gas layer (referred to as 2 DEG layer hereafter) is formed in a portion of a GaAs layer not including impurities, and is located adjacent to the heterojunction interface by placing a GaAs layer not including impurities in contact with an AlGaAs layer (spacer layer) not including impurities, and then, an AlGaAs layer including N-type impurities (carrier supply layer) is connected to the AlGaAs layer (spacer layer).

But, in the use of a magnetic sensor having the above construction, a problem arises in that a high level output cannot be obtained by the sensor even when a high electrical field is applied thereto, because when a high electrical field is applied thereto, excess carriers are generated in the N-type AlGaAs layer, which contribute to an electrical parallel conduction together with the 2 DEG carriers, and because when a high electrical field is applied thereto, the energy of the electrons in the 2 DEG layer becomes high, the average Hall mobility will be reduced and therefore the magnetic field sensitivity will be saturated.

To overcome the drawbacks mentioned above, the object of the invention is to provide a magnetic sensor having a high level output without a saturation of the sensitivity thereof even when a high electrical field is applied thereto.

To attain the object of the invention, the magnetic sensor is basically constructed as a heterojunction type magnetic field sensor composed of a heterojunction forming a two-dimensional electron gas layer having a high mobility and provided at a junction portion of at least two different kinds of semiconductor layers having a different band gap from each other, the magnetic sensor being provided that with at least a semiconductor layer having a quantum well structure in at least one of the different kinds of semiconductor layers, and the ground state subband thereof being higher than that of the two-dimensional electron gas layer.

To facilitate understanding of the principle of this invention, first the design theory for a Hall device, which is the basic magnetic sensor, is explained.

In a Hall device having a rectangular shape, the relationship between the input voltage $V_{in}$ and the output voltage (Hall voltage) $V_H$ is represented by the following equation, when the $V_{in}$ is sufficiently low.

$$V_H = (W/l) \cdot \mu_{HO} \cdot B \cdot V_{in} \qquad (1)$$

Wherein, l and W represent the length and the width of the Hall device, respectively, $\mu_{HO}$ represents the Hall mobility at the low electrical field of the device, and B represents the magnetic flux density.

When the input voltage is increased, the reduction of the Hall mobility caused by the generated Joule heat and the characteristic of the electrical field dependency must be considered, and therefore, the maximum Hall voltage $V_{HMAX}$ is represented by he following equation.

$$V_{Hmax} = B \cdot W \cdot \mu_H(E) \cdot (2 \cdot h \cdot \Delta T \cdot \rho / t)^{\frac{1}{2}} \qquad (2)$$

Wherein, $\mu_H(E)$, h, $\rho$, and t represent the Hall mobility in a high electrical field, the coefficient of heat transfer, the resistivity, and the thickness of the Hall device, respectively, and $\Delta T$ represents the difference between the temperature of the Hall device and that of the ambient atmosphere.

In this equation (2), $\rho/t$ represents the resistance of the device, but the value of this resistance of the device preferably has a range of, for example, several ten ohms ($\Omega$) to several kilo ohms ($\Omega$), to match the external circuits.

Therefore, to obtain a high output from the device even when a high electric field is applied thereto, the Hall mobility thereof under such a high electric field must be made large, in accordance with the conditions mentioned above.

SUMMARY OF THE INVENTION

The object of the invention is to provide a heterojunction magnetic field sensor having a highh sensitivity without a saturation of the sensitivity thereof, even when a high electric field is applied thereto, and able to obtain an enhanced output based upon increments of the Hall mobility under such a high electric field.

To attain the object of the invention, in accordance with this invention, there is provided a heterojunction magnetic field sensor having a two-dimensional electron gas layer (2 DEG layer) and at least a semiconductor layer having a quantum well structure, the energy level of the ground state subband thereof being higher than that of free carriers in the two-dimensional electron gas layer, provided adjacent to and in contact with the two-dimensional electron gas layer, whereby a heterojunction magnetic field sensor having a high sensitivity which is not saturated even under a high electric field and can obtain an enhanced output based upon increments of the Hall mobility, is obtained by utilizing certain characteristics thereof under the high electric field.

As a further specific embodiment of this invention, the heterojunction magnetic field sensor has a construction such that; a heterojunction magnetic field sensor comprises at least a semiinsulating semiconductor substrate, a first semiconductor layer formed on the substrate as a buffer layer, a second semiconductor layer formed on the first semiconductor layer including a spacer layer and a carrier supply layer therein, and at least one heterojunction structure formed between at least two of said layers arranged adjacent to each other, and the band gaps of each layer are different from each other.

The heterojunction magnetic field sensor is further characterized in that the spacer layer comprises a semiconductor layer having at least a quantum well structure therein, and a two-dimensional electron gas layer is formed at the interface of the heterojunction between the first semiconductor layer and the quantum well structure, wherein a ground state subband of the quantum well structure is higher than that of the two-dimensional electron gas layer.

BRIEF DESCRIPTION OF THE DRAWINGS

The following description is made with reference to the accompanying drawings, in which.

DESCRIPTION OF THE PREFERRED EMBODIMENTS

In this invention, the basic construction of the heterojunction magnetic field sensor is as mentioned above, although a plurality of semiconductor layers each havingg such a quantum well structure also can be provided in a spacer layer and a superlattice structure may be introduced into the carrier supply layer in the second layer.

Figure 2:
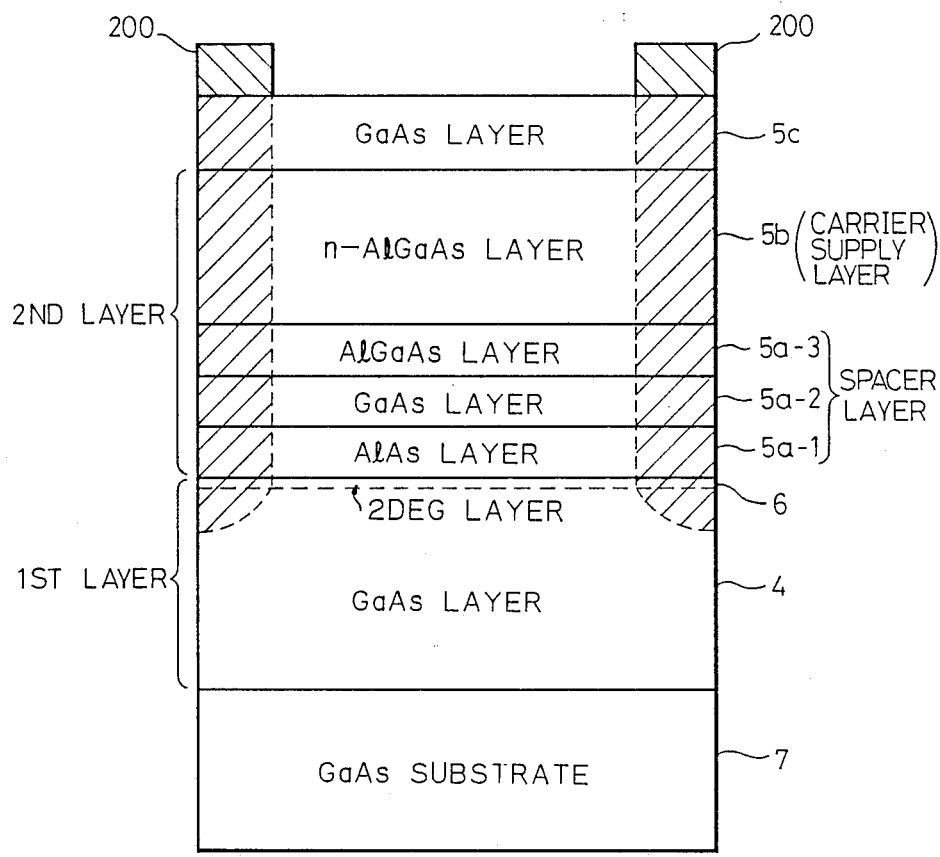
FIG. 2 is a cross sectional view of the heterojunction Hall device shown in Example 1.

As shown in FIG. 2, in this invention the substrate is mainly composed of semiconductor layers of GaAs having a semi-insulating characteristic.

The first semiconductor layer epitaxially grown on the substrate is generally called a buffer layer, and in this invention, may be a non-doped GaAs layer.

The second semiconductor layer is formed on the buffer layer and this layer includes at least a spacer layer and a carrier supply layer.

In this invention, the heterojunction structure is basically formed between the non-doped GaAs layer as a buffer layer and the spacer layer having a different energy band.

Typically, in this invention, the two-dimensional electron gas layer is formed at the interface of the heterojunction between the non-doped GaAs of the first layer and the non-doped AlAs layer which is the most bottom layer of the spacer layer.

A characteristic feature of this invention is the provision of a quantum well structure in the spacer layer. The most typical quantum well structure of this invention is a combination of three different types of the semiconductor layers consisting of AlAs/GaAs/AlGaAs. In this combination, the most left end of the layer, i.e., AlAs is contacted to the buffer layer.

Note, in this invention, other kinds of quantum well structures consisting of other combinations of the semiconductor layers may be used.

In this invention, the ground state subband of the quantum well structure must be higher than that of the two-dimensional electron gas layer.

As described above, in this invention, the semiconductor layer having such a quantum well structure is in contact with the two dimensional electron gas layer having a low energgy level, and therefore, the electrons in the 2 DEG layer and having an increased effective mass after receiving energy when the high electric field is applied thereto, are real-space transferred to the quantum well having a higher energgy level than that of the 2 DEG layer, and at that time, since a part of the energy thereof is converted into a potential energy, the effective mass of the electron is reduced causing an increase the carrier mobility.

To facilitate the real-space transfer of the electrons the number of carriers enterin the quantum well layer should be increased, although when the thickness of the quantum well layer is increased, the energy level of the quantum well layer will be reduced, and therefore, the mobility will not be greatly increased because the enegry loss of the electrons is small even if the electrons have made an real-space transfer.

Nevertheless, by providing a plurality of quantum well layers, the number of electrons with which the quantum well layers can be filled can be increased without reducing the energy level of the each quantum well layer, and thus the mobility thereof can be increased compared with the case in which only one of the quantum well layers is provided, because the real-space transfer occurs very easily.

Further, since the excess carriers generated in the carrier supply layer under the high electric field will fill not only the 2 DEG layer but also the semiconductor layer having the quantum well structure, the 2 DEG layer will not be saturated with the excess carriers thus generated, and the excess carriers having low mobility in the carrier supply layer will be decreased. Therefore, such a reduction of the average mobility caused by the generation of excess carriers, which contribute to an electrical parallel condition together with the 2 DEG carriers, can be prevented.

Moreover, when a plurality of quantum well layers are provided in accordance with this invention, the number of carriers able to be received by the quantum well layer will be further increased, to further increase the mobility, and thus a heterojunction magnetic field sensor having an enhanced output even under a high electric field can be obtained.

The present invention will be described in more detail with reference to the accompanying drawings and by way of examples.

EXAMPLE 1

Figure 1:
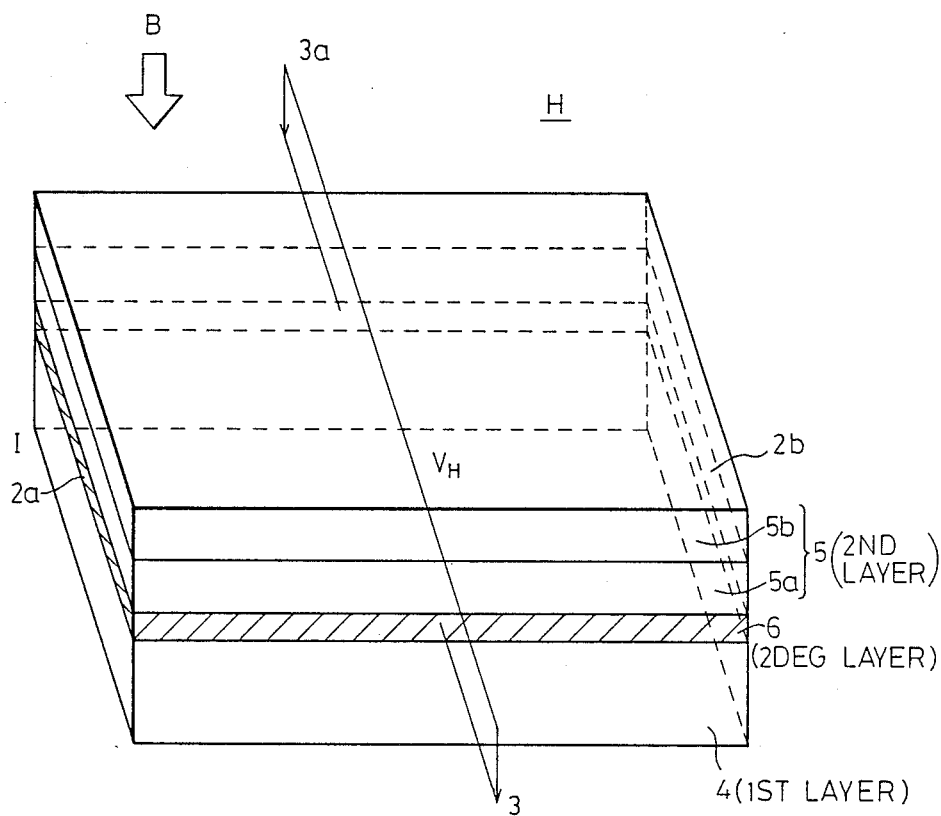
FIG. 1 is a schematic perspective view of a heterojunction Hall device shown in Example 1 of the invention.

FIG. 1 is a schematic perspecting view of the construction of the invention when applied to a Hall device.

In this embodiment, the basic construction of the device comprises a substrate 7, first and second semiconductor layers 4 and 5 formed on the substrate, the second layer consisting of a spacer layer and a carrier supply layer, and a two-dimensional electron gas layer 6, referred to as the 2 DEG layer, is formed at the interface of the heterojunction between the first semiconductor layer 4, as a buffer layer, and the spacer layer 5a of the second layer 5, each having a different band gap, respectively.

The second semiconductor layer 5 comprises a semiconductor layer doped with impurities 5b (referred to as a carrier supply layer) and a non-doped semiconductor layer 5a (referred to as a spacer layer); the semiconductor layer 5a, i.e., the spacer layer, having a quantum well structure.

Further, as shown in FIG. 1, electric current terminals 2a and 2b for passing the current into the Hall device and Hall terminals 3a and 3b for outputting the electromotive force $V_H$ generated when a magnetic field having a magnetic flux density of B is applied to the Hall device H, are provided on the device.

Hereunder, the specific construction and the method of manufacture of the above Hall device H will be explained.

In FIG. 2, the construction of the heterojunction semiconductor having a quantum well layer is shown as Example 1.

A non-doped GaAs layer 4 as a buffer layer, a non-doped barrier layer 5a-1, a non-doped well (quantum well) layer 5a-2 a non-doped barrier layer 5a-3, a carrier supply layer 5b, and an Si-doped GaAs layer 5c are formed, in this order, on the surface of the semiinsulating GaAs substrate 7 by the molecular beam epitaxy method.

In this process, the vapor phase growth method using an organic metal or the liquid phase epitaxial growth method also may be used in this invention to form the construction described above.

The construction of the heterojunction semiconductor in Example 1 will be now fully explained. In this construction the non-doped barrier layer 5a-1, the non-doped well (quantum well) layer 5a-2, the non-doped barrier layer 5a-3, and the carrier supply layer 5b are a non-doped AlAs layer, a non-doped GaAs layer a non-doped AlGaAs layer, and an Si-doped AlGaAs layer, respectively. In this Example, the combination of layers of the quantum well structure is AlAs/GaAs/AlGaAs.

As apparent from FIG. 2, the 2 DEG layer 6 is formed at the interface heterojunction in the non-doped GaAs layer 4.

The quantum well structure consisting of the non-doped barrier layer 5a-1, 5a-3 and the non-doped well layer 5a-2 is provided not only to prevent an intrusion of Si inside the carrier supply layer 5b doped with N-type silicon into the non-doped GaAs layer 4, but also to increase the mobility under the high electric field.

Further Au-Ge ohmic electrodes 200 serving as the electrodes of the current terminals 2a, 2b and the Hall terminals 3a, 3b as mentioned above are provided to form an ohmic contact with each layer 4, 5a-1, 5a-2, 5a-3, 5b and 5c described above, respectively.

In this Example, Au-Sn electrodes in which the occurrence of noise is less, especially at a low frequency may be used instead of the Au-Ge ohmic electrodes.

The semi-insulating GaAs substrate used for the crystal growth was cleaned by first etching with a composite liquid of concentrated sulfuric acid, hydrogen peroxide, and pure water, the volumetric ratio thereof being 4:1:1, respectively, for about one minute and at a liquid temperature of 60° C., followed by a thermal etching operation whereby a vapor of arsenic was applied thereto, in a vacuum chamber used for crystal growth.

The conditions for the crystal growth in Example 1 were as follows,

1. Ga flux: $4.8 \times 10^{-7}$ Torr
2. As flux: $1.0 \times 10^{-5}$ Torr
3. Al flux: $1.2 \times 10^{-7}$ Torr
4. Temperature of the crystal growth: 630° C.
5. Crystal growth rate:
    1.20 μm/hr (GaAs)
    1.65 μm/hr (AlGaAs)
    0.45 μm/hr (AlAs)
6. First layer: non-doped GaAs (500 nm)
    Second layer (barrier layer): non-doped AlAs (1.5 nm)
    Second layer (quantum well layer): non-doped GaAs (2.0 nm)
    Second layer (barrier layer): non-doped AlGaAs (5.0 nm)
    Second layer (carrier supply layer): Si-doped AlGaAs (75 nm)
    Third layer: Si-doped GaAs (10 nm)
The Si-doping density in this case was $1 \times 10^{18}$ cm$^{-3}$,
7. The ohmic electrode was made of an alloy consisting of an evaporated film of AuGe (7% to 12%)/Ni/Au.

The function of the heterojunction Hall device in accordance with this Example will be described hereunder with reference to FIG. 3.

Figure 3:
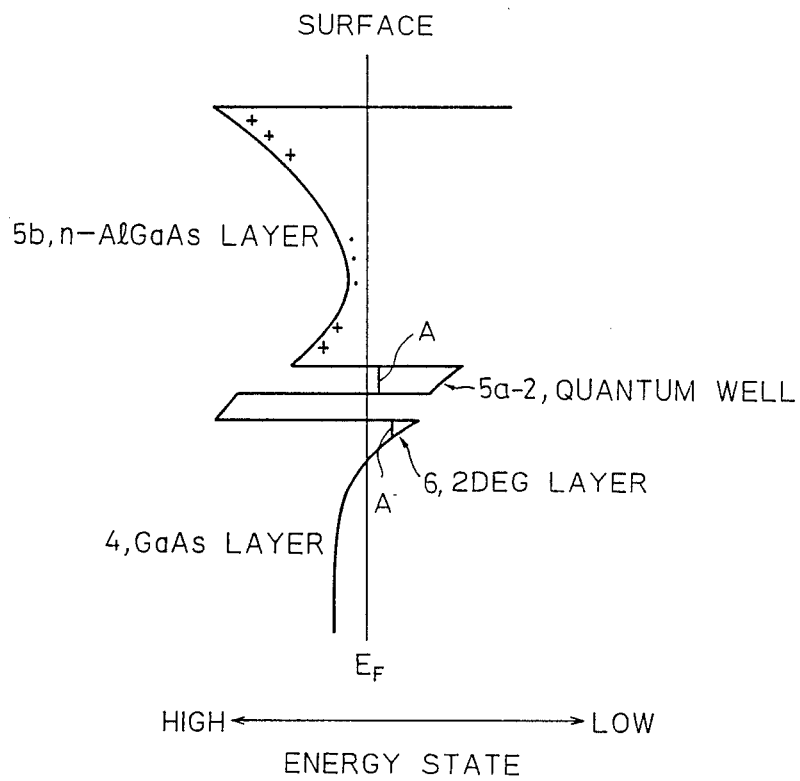
FIG. 3 is a diagram of an energy band of the device shown in Example 1.

FIG. 3 shows an energy band configuration in the Hall device having the above construction.

In FIG. 3, both the energy condition of the bottom of the conduction band and the ground state subband A caused by the quantum effect are shown in respect to the quantum well 5a-2 and the 2 DEG layer 6, respectively.

In this Example, the energy level of the ground state subband A of the quantum well structure 5a-2 was higher than that of the two-dimensional electron gas layer.

First, when low field voltage was not applied to the current terminals 2a and 2b, the current flowed inthe 2 DEG layer 6 filled with high mobility electrons.

In the bulk GaAs, when a high electric field was applied thereto, the mobility of the electrons in the 2 DEG layer 6 was decreased due to the high field effect.

In Example 1, however, since the GaAs layer 5a-2 having an energy level of the ground state subband A that is slightly higher than that of the 2 DEG layer 6 was provided through the non-doped AlAs layer 5a-1 having a width of 1.5 nm, the electrons were real-space transferred to fill the GaAs layer 5a-2 through the non-doped AlAs layer 5a-1. Therefore, a part of the energy of the electron for filling the GaAs layer 5a-2 was converted into potential energy, and thus the effective mass of the electron was reduced to again increase the mobility thereof.

Moreover, the excess carriers in the AlGaAs layer 5b, i.e., the carrier supply layer, generated by applying the high electric field thereto can take the energy conditions not only in the 2 DEG layer 6 but also in the quantum well layer 5a-2, and therefore, can prevent the existence of excess carriers having the low level of the mobility, and thus prevent a reduction of the average mobility.

When the width of the GaAs layer 5a-2 becomes large, however, the energy condition of the GaAs layer 5a-2 will be reduced to increase the number of the electrons remaining in the GaAs layer 5a-2 even under a low electric field, and thus the effect described above can not be obtained.

Figure 4:
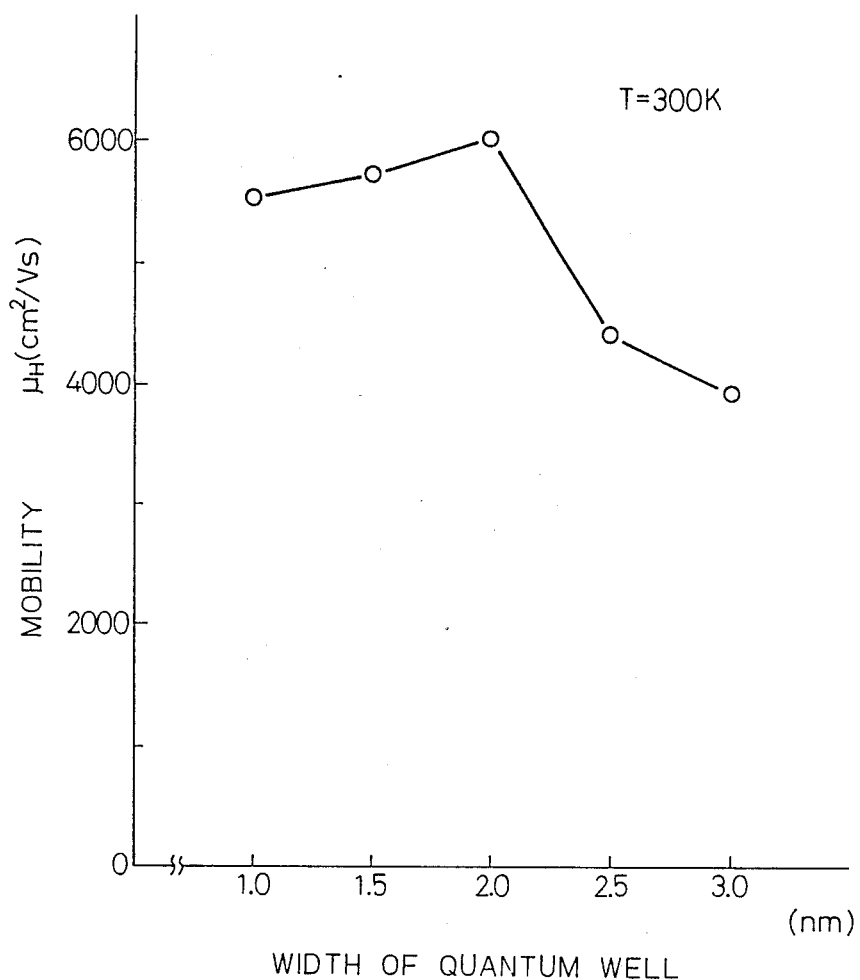
FIG. 4 is a characteristic chart representing the relationship between the Hall mobility and the width of the quantum well structure in the spacer layer under a low electric field in Example 1.

According to research by the inventors of the invention into the relationship between the width of the quantum well (the thickness of the well 5a-2) and the Hall mobility under a low electric field, by changing the width of the quantum well 5a-1 in Example 1, the results thereof shown in FIG. 4 show that the Hall mobility thereof is sharply reduced when the width of the quantum well is more than 2.5 nm.

Accordingly, in this invention, the width of the quantum well structure is preferably less than 2.5 nm.

EXAMPLE 2

Next, an embodiment in which a superlattice structure is provided as the carrier supply layer will be explained.

Figure 5:
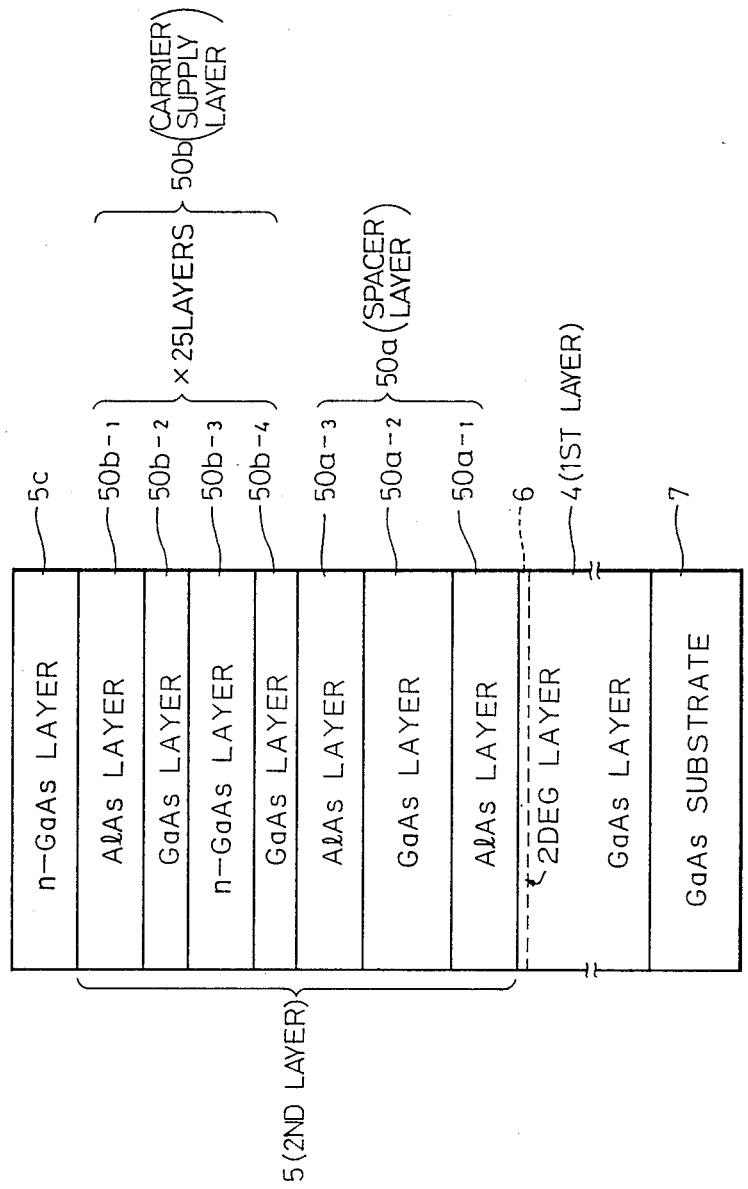
FIG. 5 is a cross sectional view of the heterojunction Hall device shown in Example 2.

FIG. 5 is a cross sectional schematic view of the construction of the device of Example 2, in which a non-doped GaAs layer 5, a 2 DEG layer 6, a non-doped AlAs 50a-1 as a barrier layer, a non-doped GaAs layer 50a-2 as a quantum well, a non-doped AlAs layer as a barrier layer 50a-3, a superlattice structure 50b as a carrier supply layer comprising a non-doped GaAs layer 50b-4, an Si-doped GaAs layer 50b-3, a non-doped GaAs layer 50b-2, a non-doped AlAs layer 50b-1, and an Si-doped GaAs layer 5c as a surface layer, are formed, in this order, on the surface of the semi-insulating GaAs substrate 7 by, for example, a molecular beam epitaxy method.

The non-doped GaAs layer 50b-4, the Si-doped GaAs layer 50b-3, the non-doped GaAs layer 50b-2, and the non-doped AlAs layer 50b-1 together form the superlattice structure 50b.

In Example 2, a non-doped AlAs layer as a barrier layer 50a-3 had a smaller thickness of 1.5 nm, compared to that of the corresponding AlGaAs layer 5a-3 in Example 1.

In Example 2, the basic unit of the superlattice structure 50b of the invention was, for example, a layered construction consisting of a non-doped AlAs layer 50b-1 having a thickness of 1.5 nm, a non-doped GaAs layer 50b-2 having a thickness of 0.5 nm, an Si-doped GaAs layer 50b-3 having a thickness of 1.5 nm, and a non-doped GaAs layer 50b-4 having a thickness of 0.5 nm. The total thickness of the unit of the superlattice structure was 4 nm.

In this invention, the superlattice structure having a total thickness of 100 nm produced by stacking 25 of the above unit structures can be replaced by the semiconductor 50b in Example 1 of this invention. The Si-doping density in the Si-doped GaAs layer 50b-3 was $1 \times 10^{18}$ cm$^{-3}$. In this Example 2, the construction of the quantum well is the combination of three layers represented by AlAs/GaAs/AlAs.

Figure 6:
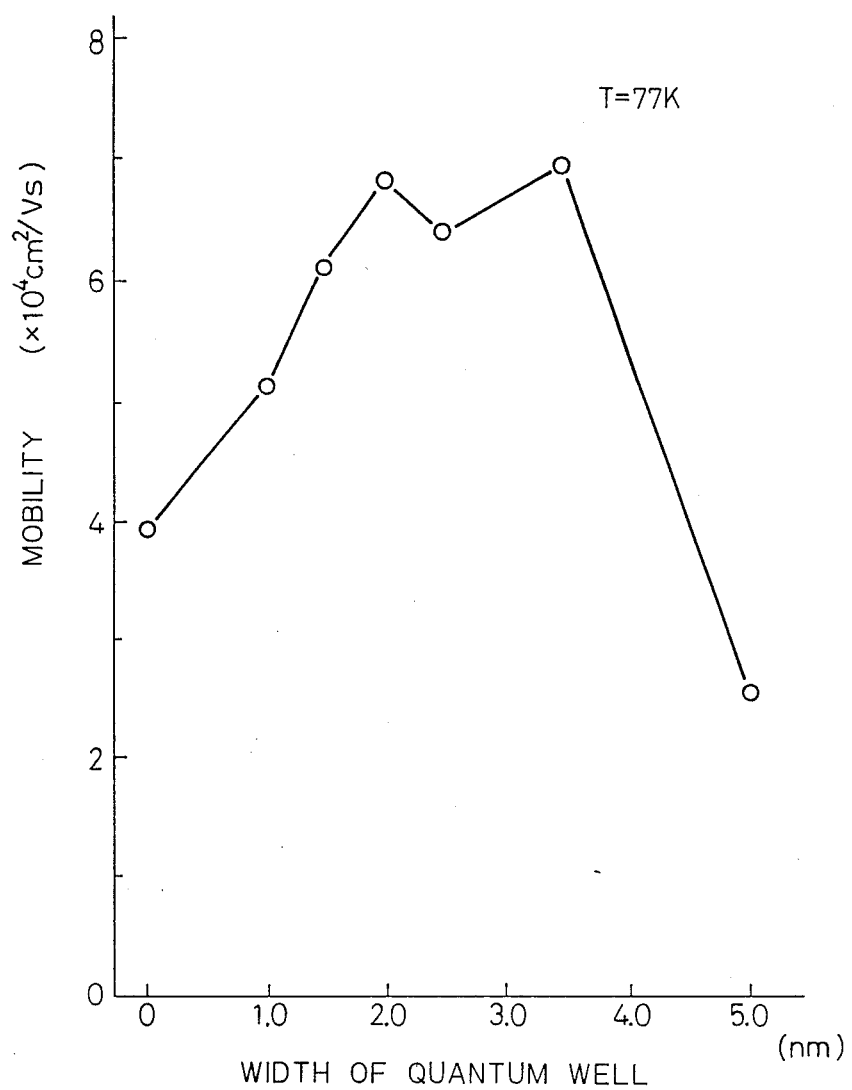
FIG. 6 is a characteristic chart representing the relationship between the Hall mobility and the width of the quantum well structure in the spacer layer under a low electric field in Example 2.

FIG. 6 shows a dependency of the mobility on the width of the quantum well structure.

As shown in FIG. 6, the Hall mobility is sharply reduced when the width of the quantum well is more than 5.0 nm.

The reason the width of the quantum well structure at which the sharp reduction of the mobility occurred in Example 2 is wider than that of Example 1 (shown in FIG. 4) is because the thickness of the non-doped AlAs layer 50a-3 is smaller than that of the non-doped AlGaAs layer 5a-3 in Example 1.

Next, the driving characteristics of the magnetic field sensor as explained in Example 1 and 2 under a high electric field will be explained with reference to data obtained by the inventors of this invention.

Figure 7:
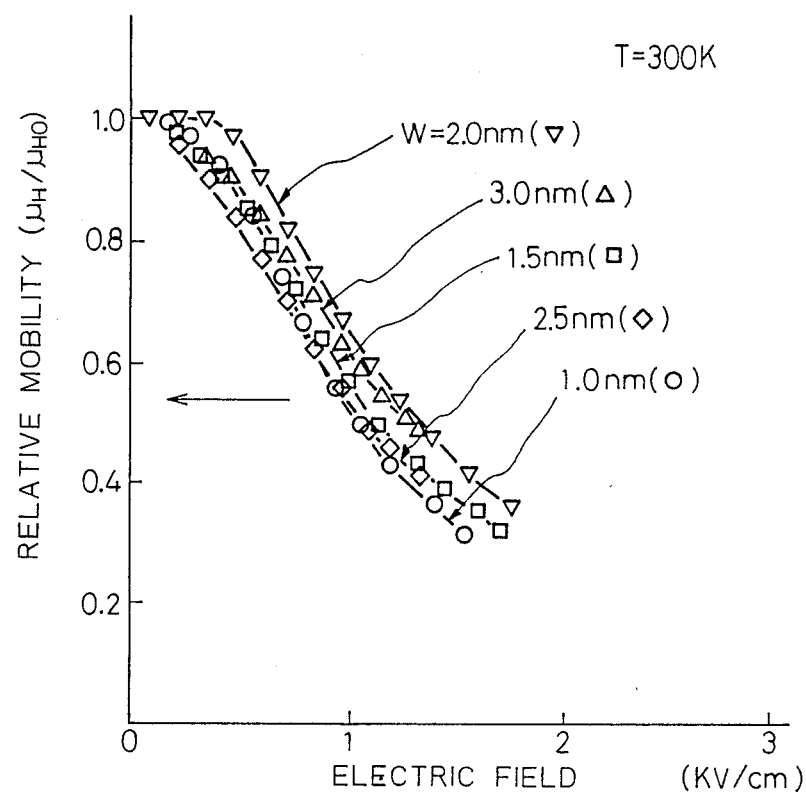
FIG. 7 is a characteristic chart representing the relationship between the relative Hall mobility and the input electric field as a parameter of the width of the quantum well in the spacer layer in Example 1.

FIG. 7 shows the dependency of the Hall mobility of the heterojunction Hall device provided with a quantum well layer in Example 1 on the electric field.

As shown by the results in FIG. 7, when a device in which the width of the quantum well structure is less than 2.0 nm, and wherein a reduction of the mobility under a low electric field does not occur, is used, the amount of reduction of the mobility under the high electric field is reduced as the width of the quantum well structure is increased.

Figure 8:
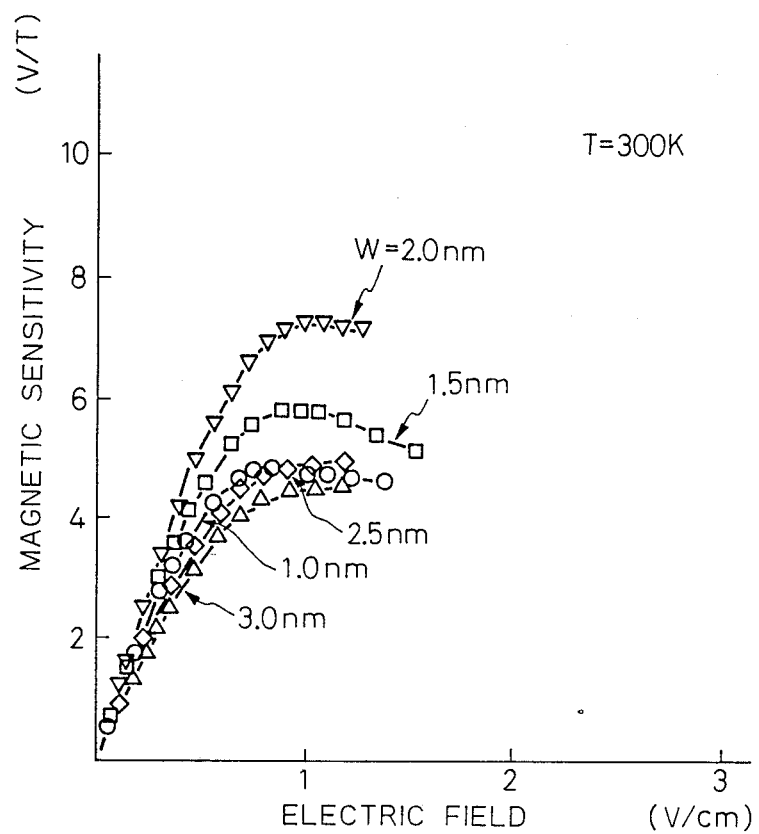
FIG. 8 is a characteristic chart representing the relationship between the magnetic sensitivity and the input electric field as a parameter of the width of the quantum well in the spacer layer in Example 1.

Further, the dependency of the sensitivity of the magnetic field of the device in Example 1 on the electric field is shown in FIG. 8.

As apparent from FIG. 8, the sensitivity of the magnetic field of the device is at a maximum when a device wherein the width of the quantum well structure is 2.0 nm is used.

Figure 9:
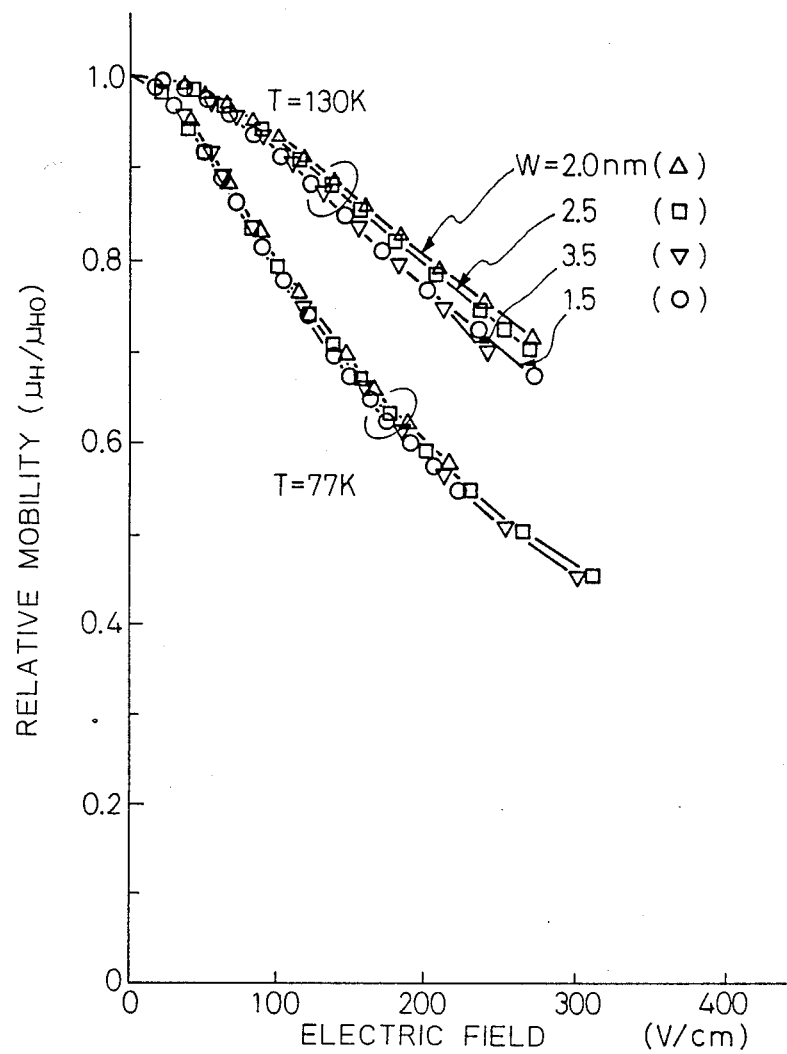
FIG. 9 is a characteristic chart representing the relationship between the relative Hall mobility and the input electric field as a parameter of the width of the quantum well in the spacer layer in Example 2.

Further, the dependency of the Hall mobility of the superlattice Hall device having a quantum well layer of Example 2 on the width of the quantum well structure is shown in FIG. 9 in the form of a relative mobility $\mu_H/\mu_{H0}$.

As apparent from FIG. 9, the mobility is at a maximum when a device wherein the width of the quantum well structure is 2.0–2.5 nm is used.

Note, the above data was obtained under low temperature conditions because it is necessary to avoid variations of such measured data caused by a deep energy level of the donor.

In table 1, the amounts of maximum magnetic field sensitivity obtained by the devices of Example 1 and 2 of the invention are shown together with the comparative data obtained by the device having the same construction as that of the Example 1 and 2 except that the quantum well structure is omitted, referred to as Comparative examples 1 and 2, respectively.

TABLE 1

| Item | Construction | Maximum magnetic field sensitivity |
|---|---|---|
| Comparative Example 1 | Without quantum well structure | 5.7 V/T |
| Example 1 | With quantum well structure | 7.0 V/T |
| Comparative Example 2 | Without quantum well structure | 11 V/T |
| Example 2 | With quantum well structure | 18 V/T |

As shown in Table 1, in Example 1, the maximum magnetic field sensitivity was 7.0 V/T when the width of the quantum well structure was 2.0 nm, and a greater than 20% increment of the output of the heterojunction Hall device of this invention was obtained, compared with the heterojunction Hall device of Comparative Example 1.

On the other hand, in Example 2, the maximum magnetic field sensitivity was 18 V/T when the width of the quantum well structure was 2.5 nm and a greater than 60% increment of the output of the heterojunction Hall device of this invention was obtained, compared with the heterojunction Hall device having the superlattice construction of Comparative Example 2.

In this invention, the positional relationship among the semiconductor layer having the quantum well structure, two-dimensional electron gas layer, and carrier supply layer can be changed. When such a superlattice structure is used in the carrier supply layer, instead of the AlGaAs layer, the mobility under a high electric field is increased because a so called DX center (deep energy level) which appears in the AlGaAs layer and is a source of excess carriers under a high electric field causing a parallel conduction, do not exist.

EXAMPLE 3

Another Example of this invention having a plurality of quantum well structures inside the Hall device will be explained as Example 3.

Figure 10:
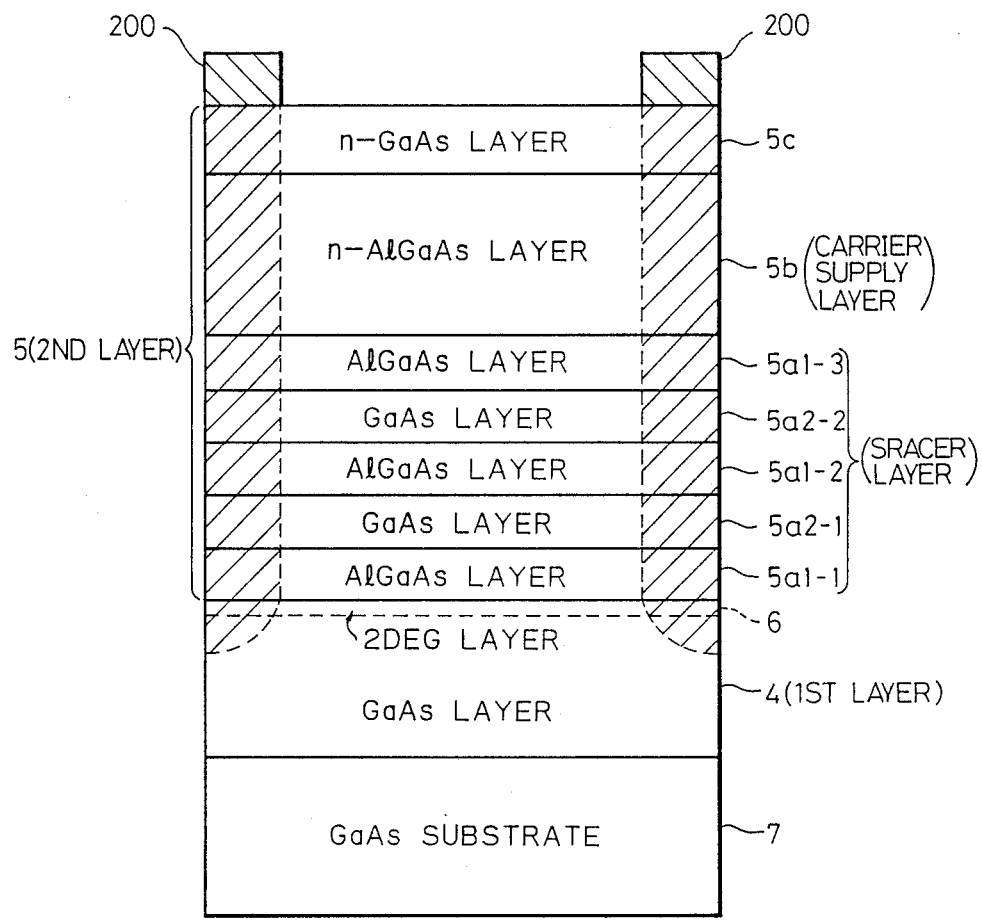
FIG. 10 is a cross sectional view of the heterojunction Hall device shown in Example 3.

In FIG. 10, a construction of the heterojunction semiconductor of this invention is disclosed in which two non-doped quantum well layers are provided.

In this Example the quantum well is consisting of the combination of layers in which, a non-doped barrier layer $5a1$-1, a non-doped well (quantum well) layer $5a2$-1, a non-doped barrier layer $5a1$-2, a non-doped well (quantum well) layer $5a2$-2, a non-doped barrier layer $5a1$-3 are formed in this order by, for example, the molecular beam epitaxy method, and another component thereof is the same as that of Example 1.

In this Example 3, the non-doped AlGaAs layers are used as the barrier layers $5a1$-1, $5a1$-2 and $5a1$-3 and the non-doped GaAs layers are used as the quantum well layers $5a2$-1 and $5a2$-2. Further the Si-doped AlGaAs layer is used as the carrier supply layer $5b$. In this Example, an unit of the quantum well has a combination of AlGaAs/GaAs/AlGaAs and the whole well has a combination of AlGaAs/GaAs/AlGaAs/GaAs/AlGaAs.

The quantum well structure consisting of the non-doped barrier layers $5a$-1, $5a1$-2 and $5a1$-3 and the non-doped well layers $5a2$-1 and $5a2$-2 is provided to ensure to get the same effect as described in Example 1.

Further, Au-Ge ohmic electrodes 200 serving as the electrodes of the current terminals $2a$, $2b$ and the Hall terminals $3a$, $3b$, as shown in FIG. 1, are provided to form an ohmic contact with each layer 4 $5a1$-1, $5a2$-1, $5a1$-2, $5a2$-2, $5a1$-3 $5b$, and $5c$ described above, respectively.

The semi-insulating GaAs substrate used for the crystal growth was cleaned by the same way as explained in Example 1.

The conditions for the crystal growth in Example 3 were the same as that of in Example 1, except the conditions about for making a plurality of quantum wells, as shown hereunder.

First layer: non-doped GaAs (500 nm)
Second layer (barrier layer): non-doped AlGaAs (1.5 nm)
Second layer (well layer): non-doped GaAs (2.5 nm)
Second layer (barrier layer): non-doped AlGaAs (1.5 nm)
Second layer (well layer): non-doped GaAs (2.5 nm)
Second layer (barrier layer): non-doped AlGaAs (1.5 nm)
Second layer (carrier layer): Si-doped AlGaAs (75 nm)
Third layer: Si-doped GaAs (10 nm)
The Si-doping density in this case was $1 \times 10^{18}$ cm$^{-3}$, The function of the heterojunction Hall device in accordance with Example 3 will be described hereunder with reference to FIG. 11.

Figure 11:
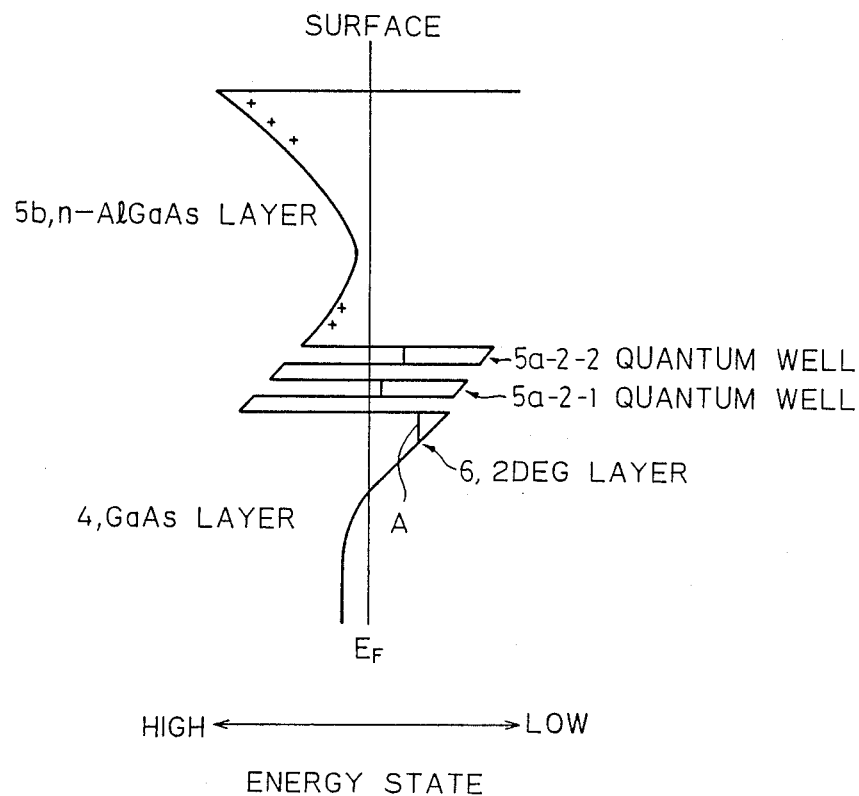
FIG. 11 is a diagram of an energy band of the device shown in Example 3.

As explained with respect to FIG. 3, FIG. 11 shows an energy band configuration in the Hall device having the construction of Example 3 above.

In FIG. 11, both energy condition of the bottom of the conduction band and the ground state subband A caused by the quantum effect are also shown with respect to each of the quantum well $5a2$-1 and $5a2$-2 and the 2 DEG layer 6.

In Example 3, when a high electric field was applied since the GaAs layer $5a2$-1 and $5a2$-2 having the energy level of the ground state subband A slightly higher than that of the 2 DEG layer 6 was provided with the non-doped AlGaAs layers $5a1$-1, $5a1$-2, and $5a1$-3 having a width of 1.5 nm, therebetween, the electrons were real-space transferred to the GaAs layer $5a2$-1 and $5a$ 2-2 through the non-doped AlGaAs layer $5a1$-1 and $5a1$-2.

Therefore, a part of the energy of the electrons in the GaAs layer $5a2$-1 and $5a2$-2 were converted into potential energy, and thus the effective mass of the electrons was reduced to again increase the mobility thereof.

Moreover, the excess carriers in the AlGaAs layer $5b$, i.e., the carrier supply layer, generated therein by applying the high electric field thereto, can take the energy conditions not only in the 2 DEG layer 6 but also in the quantum well layer $5a2$-1 and $5a2$-2, and therefore, can prevent the existence of excess carriers having a low level of the mobility, to prevent a reduction of the average mobility thereof.

In Example 1, when the width of the GaAs layer $5a$-2 was wide, the energy condition of the ground state subband A of the GaAs layer $5a$-2 was reduced, which increase the number of the electrons remaining in the GaAs layer $5a$-2, even under a low electric field, and thus the effect described above could not be obtained.

In Example 3, however, by providing a plurality of quantum well structures in the Hall device, the number of carriers which can fill the quantum well layer was increased without reducing the energy level of the ground state subband A of the GaAs layer $5a2$-1 and $5a2$-2, and thus the effects mentioned above were increased.

EXAMPLE 4

Another embodiment in which the widths of the GaAs layer $5a2$-1 and $5a2$-2 in Example 3, were set at different values, for example, the width of the GaAs layer $5a2$-1 is 2.5 nm and the width of the GaAs layer $5a2$-2 is 1.5 nm, is explained as Example 4 hereunder.

In Example 4, when the energy condition of the quantum well layer $5a2$-2 existing at a position remote from the two-dimensional electron gas layer 6 was higher than that of the quantum well layer $5a2$-1 existing at a position closer to the two-dimensional electron gas layer 6, by giving each quantum well layer a different width, respectively, as described above for example, the real-space transfer of the carriers between these quantum well layers, for example from the quantum well layer $5a2$-1 to the quantum well layer $5a2$-2, provided a further increment of the carrier mobility.

EXAMPLE 5

Next, another embodiment having a superlattice structure provided in the device shown in Example 4 will be explained hereunder as Example 5.

Figure 12:
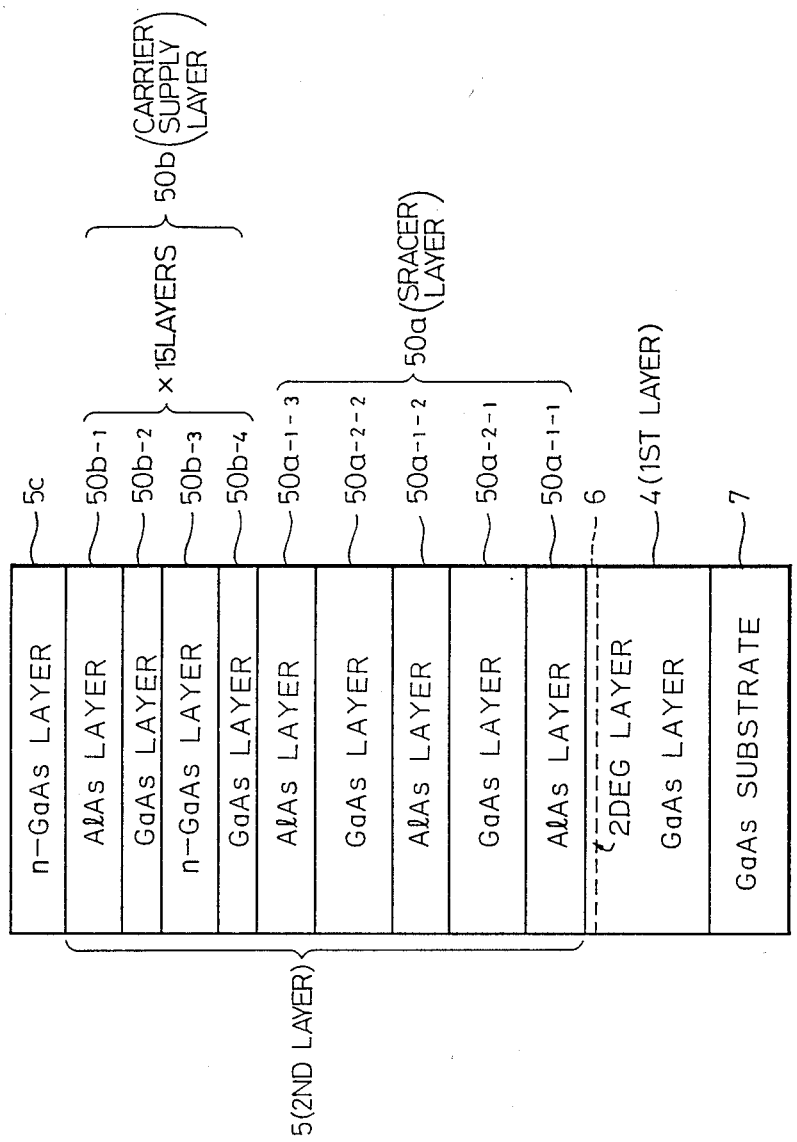
FIG. 12 is a cross sectional view of the heterojunction Hall device shown in Example 4.

As shown in FIG. 12, a non-doped AlAs layers 50a1-1, 50a1-2, and 50a1-3 were used as the barrier layers and non-doped GaAs layers 50a2-1 and 50a2-2 were used as the quantum well layers, and moreover, the carrier supply layer 5b shown in FIG. 10 was replaced by a superlattice construction referred to 50b and consisting of a non-doped AlAs layer 50b-1, a non-doped GaAs layer 50b-2, an Si-doped GaAs layer 50b-3, and a non-doped GaAs layer 50b-4, which is the same construction as in Example 2 and shown in FIG. 5.

The Si-doped GaAs layer 5c was formed on the top of this structure as a surface layer, as in FIG. 10. In this Example, the combination of the quantum well structure is AlAs/GaAs/AlAs/GaAs/AlAs In Example 5, the basic unit of the superlattice structure 50b of the invention was, for example, a layered construction consisting of a non-doped AlAs layer 50b-1 having a thickness of 1.5 nm, a non-doped GaAs layer 50b-2 having a thickness of 0.5 nm, an Si-doped GaAs layer 50b-3 having a thickness of 1.5 nm, and a non-doped GaAs layer 50b-4 having a thickness of 0.5 nm. The total thickness of the superlattice structure was 4 nm. In this invention, a superlattice structure 50b having a total thickness of 60 nm produced by stacking 15 of the above unit structures can be used instead of the semiconductor layer 5b used in Example 4 of the invention. The Si-doping density in the Si-doped GaAs layer 50b-3 was $2 \times 10^{18}$ cm$^{-3}$.

Further, in Example 5, the non-doped AlGaAs layer 5a-1 as the barrier layer in Example 3 was replaced by the non-doped AlAs layers 50a1-1 and 50a1-2 having a thickness of 1.5 nm.

As apparent from FIG. 12, a superlattice Hall device having two quantum well layers 50a2-1 and 50a2-2 of this invention is disclosed.

Figure 13:
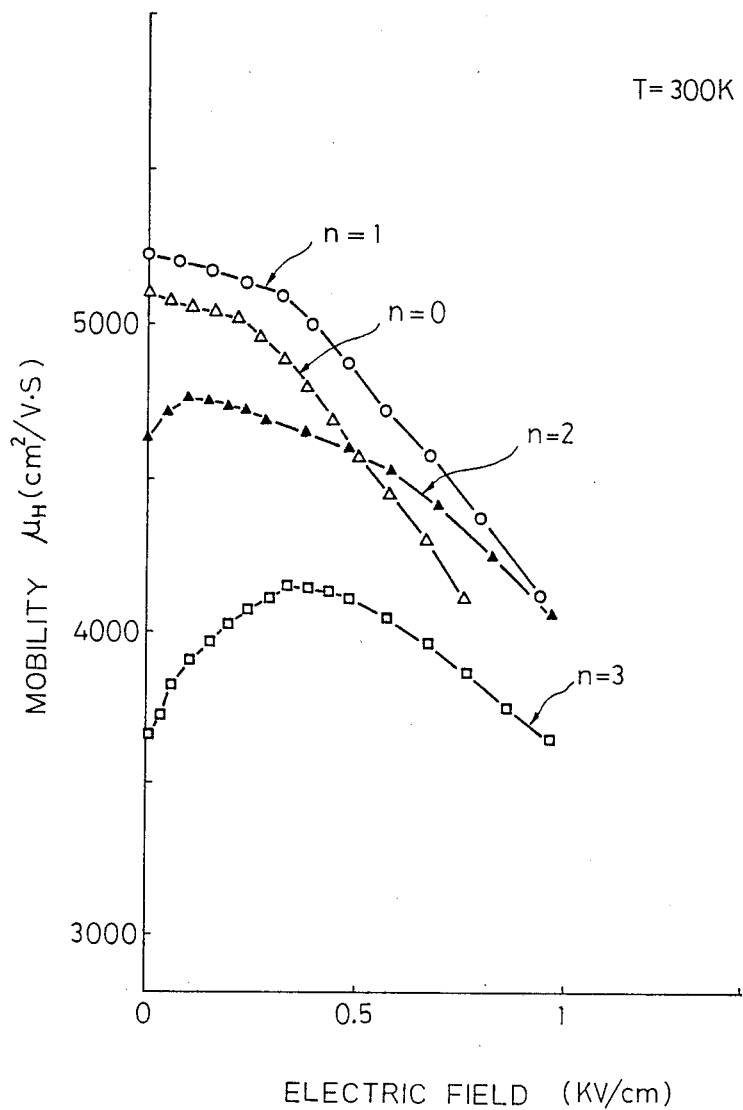
FIG. 13 is a characteristic chart representing the relationship between the Hall mobility and the input electric field as a parameter of the number of the quantum well in the spacer layer in Example 4.

FIG. 13 shows the dependency of the Hall mobility of the heterojunction Hall device provided with a quantum well layer and a superlattice construction in Example 5 on the electric field driven by a direct current.

According to the results of FIG. 13, the number of quantum well layers n (50a2-n) was increased then the mobility thereof under a low electric field was decreased, but the ratio of the reduction of mobility caused by the increment of the electric field was lowered.

The mobility under the low electric field at n=1 was higher than that of at n=0,because the separation of the impurities doped into the 2 DEG layer from the carrier existing in the 2 DEG layer was improved by increasing the thickness of the spacer layer.

Figure 14:
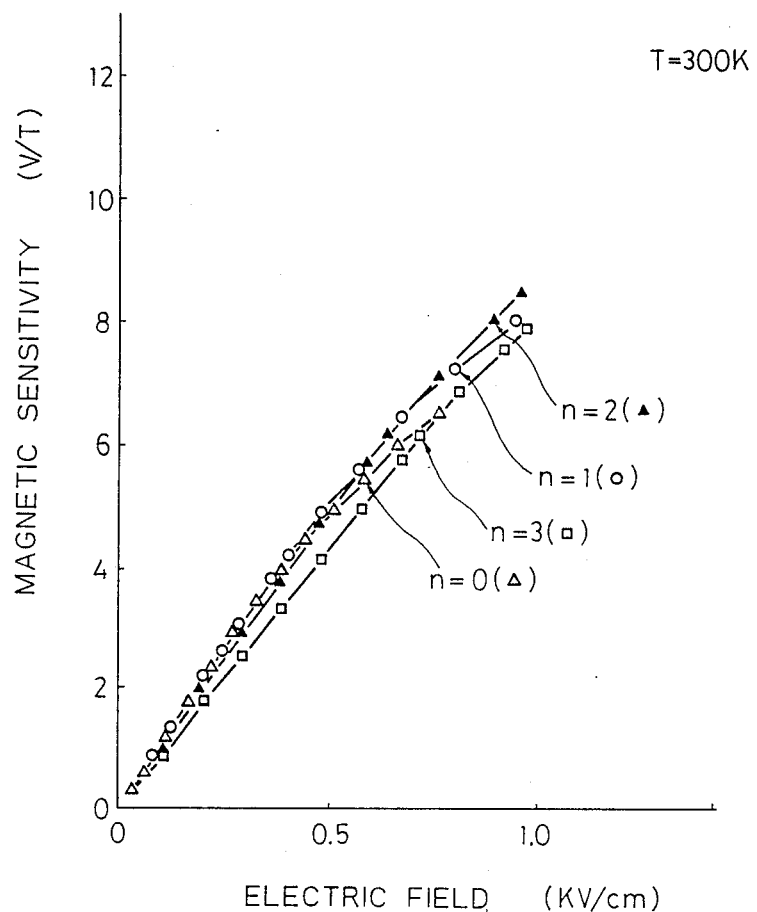
FIG. 14 is a characteristic chart representing the relationship between the magnetic sensitivity and the input electric field as a parameter of the number of the quantum well in the spacer layer in Example 5; and, FIGS. 15, 16, and 17 are cross sectional views of the heterojunction Hall devices shown in Examples 6, 7, and 8, respectively.

The dependency of the sensitivity of the magnetic field of the device in Example 5 on the electric filled when driven by a direct current is shown in FIG. 14.

As shown in FIG. 14, when the number of quantum well layers n (50a2-n) was increased, the sensitivity thereof under a low electric field was reduced, but the sensitivity thereof under a high electric field, was increased, and a much higher output was obtained, in comparison with the case where n=0.

Further, when the size of device was minimized, a higher electric field were applied to the device when input voltage was constant, the effect on the output of the magnetic sensor due to the provision of a plurality of the quantum well layers 50a2 was further enhanced.

Several variations of the Hall device of this invention, as shown in Example 5, are possible.

EXAMPLE 6

One of such embodiments has such a construction as having the double hetero structure in which a plurality of the quantum well layers being provided adjacent to the one side or both sides of the 2 DEG layer.

Figure 15:
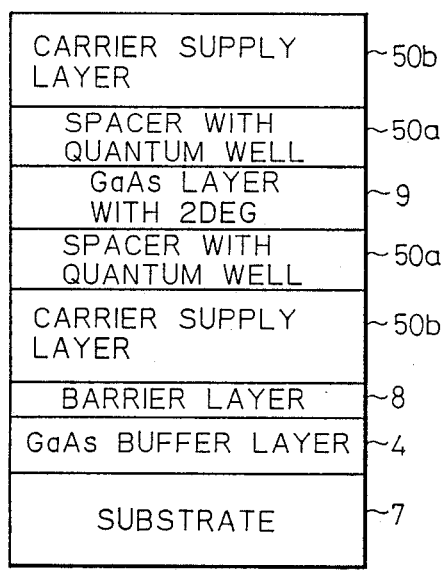

One of typical embodiment thereof is disclosed in FIG. 15 as Example 6, in which a non dope GaAs layer 4 as a buffer layer formed on a substrate 7 and a barrier layer 8 formed on the buffer layer are formed in this turn and further, a carrier supply layer 50b, a spacer layer with quantum well 50a, a GaAs layer 9 having the 2 DEG layers, a spacer layer with quantum well 50a and a carrier supply layer 50b are provided in this turn on the barrier layer 8.

In this embodiment, the barrier layer 8 is provided for preventing the 2 DEG layer to be formed in the GaAs buffer layer 4 and moreover, a 2 DEG layer is formed in the GaAs layer 9, and in a specific case may be two different 2 DEG layers are formed in the interface portion of the layer 9 both surface thereof being contacted to the quantum well layer 50a.

Figure 18:
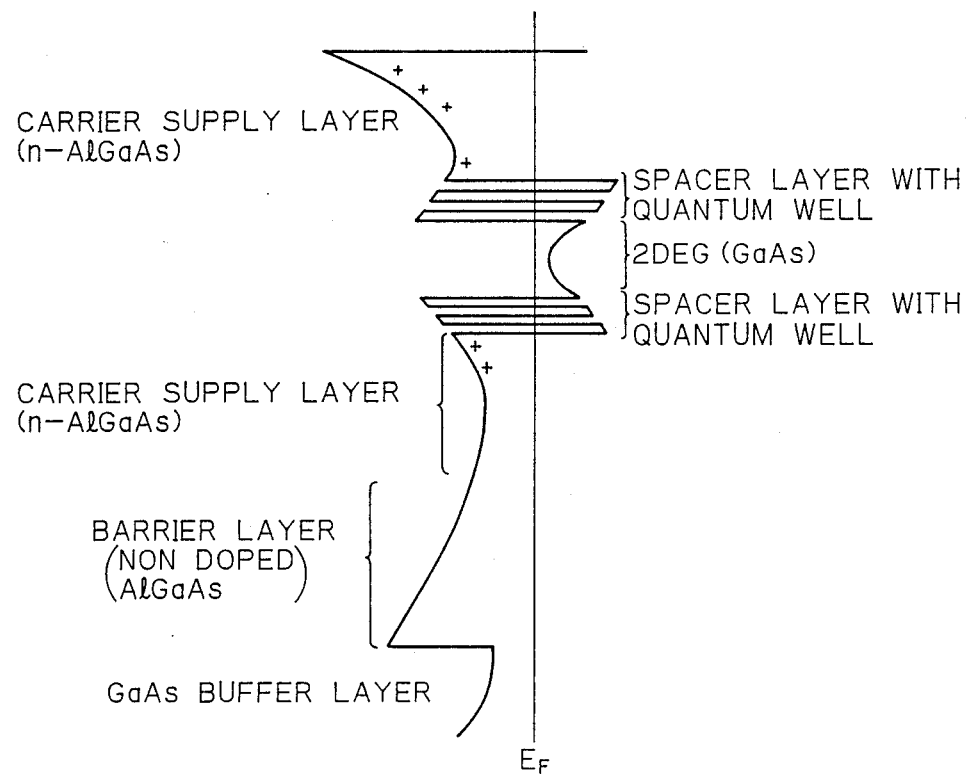
FIGS. 18 and 19 show an energy band of the device shown in FIGS. 15 and 16 respectively.

The energy band of this construction is shown in FIG. 18.

EXAMPLE 7

Figure 16:
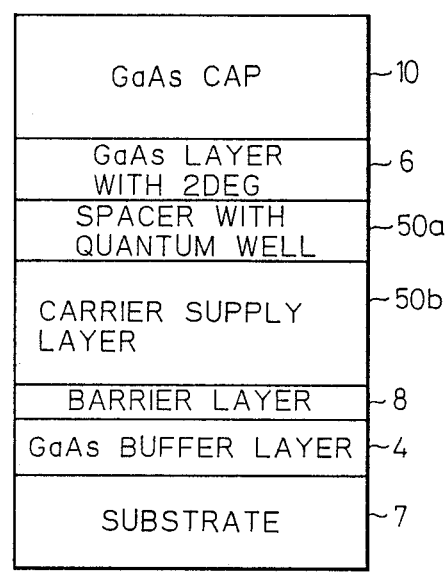

Another such embodiment is disclosed in FIG. 16 as Example 7, in which the device has the reverse type heterojunction structure.

In this embodiment, the device has a construction such that a non dope GaAs layer 4 as a buffer layer formed on a substrate 7 and a barrier layer 8 formed on the buffer layer are formed in this turn and further, a carrier supply layer 50b, a spacer layer with quantum well 50a and a GaAs cap layer 10 are provided in this turn on the barrier layer 8.

In this construction, the quantum well 50a has a plurality of quantum well layers and a 2 DEG layer 6 is formed at the interface of the heterojunction in the cap layer 10 contacting with the spacer layer with quantum well 50a.

In this embodiment, the barrier layer 8 is also provided for preventing the 2 DEG layer to be formed in the GaAs buffer layer 4.

Figure 19:
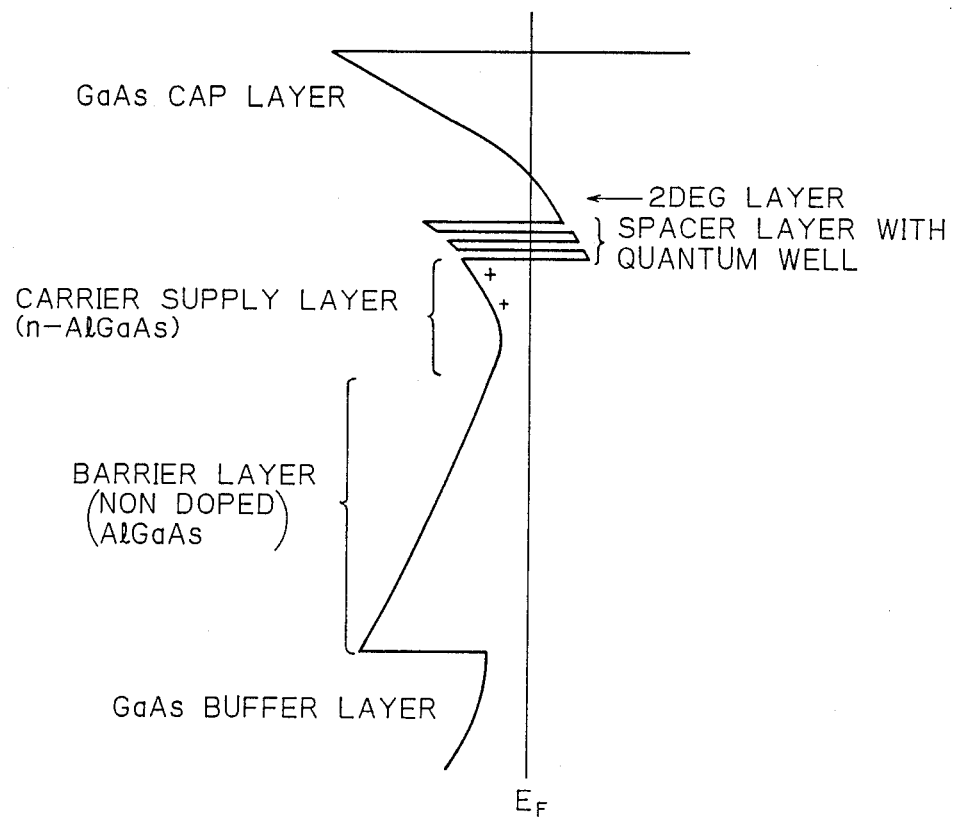

The energy band of this construction is shown in FIG. 19.

EXAMPLE 8

Figure 17:
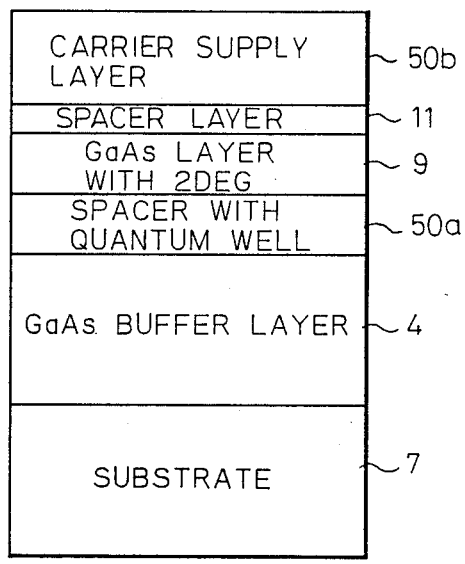

A further embodiment is disclosed in FIG. 17 as Example 8, in which the device has a heterojunction structure and the quantum well structure 50a having at least one quantum well layer is provided on the surface of the buffer layer of the non-doped GaAs layer 4 formed on the substrate 7. A GaAs layer with the two-dimensional electron gas layer 9 is provided on said quantum well structure 50 a and further the carrier supply layer 50b was provided on the GaAs layer with 2 DEG 9 with a spacer layer 11 interposed therebetween.

The device as described above in Examples 6 to 8 further enhance the output of the Hall device.

Effect of the Invention

According to this invention, since the spacer layer of the heterojunction Hall device has a quantum well structure, and because a semiconductor having a quantum well structure wherein the energy level thereof is higher than that of the two-dimensional electron gas layer is provided, the rate of reduction of the mobility thereof under a high electric field can be minimized, and thus the output of the magnetic field sensor is greatly enhanced, and accordingly, this device can greatly contribute to a remarkable improvement of the high precision required for measuring and control.

Further, in this invention, a magnetic field sensor having a sensitivity which is not saturated even under a high electric field, can be obtained.

We claim:

1. A heterojunction magnetic field sensor comprising,
   a semi-insulating semiconductor substrate,
   a first semiconductor layer formed on said substrate as a buffer layer,
   a second semiconductor layer formed on said first semiconductor layer and including a spacer layer and a carrier supply layer therein, and
   at least one heterojunction structure formed between at least two of said layers arranged adjacent to each other, the band gap of each layer being different,
   at least a two-dimensional electron gas layer formed at the interface of the heterojunction of one of two semiconductor layers consisting of said heterojunction structure, having a band gap being smaller than that of another layer,
   said heterojunction magnetic field sensor being further characterized in that,
   at least a quantum well structure, a ground state subband thereof being higher than that of said two-dimensional electron gas layer is provided in said spacer layer arranged adjacent to the two-dimensional electron gas layer.

2. A sensor according to claim 1, wherein said carrier supply layer has a superlattice structure.

3. A sensor according to claim 1, wherein said spacer layer having a quantum well structure is formed in said second layer and in contact with said buffer layer.

4. A sensor according to claim 3, wherein a two-dimensional electron gas layer is formed at the interface of the heterojunction between said buffer layer and said layer having the quantum well structure.

5. A sensor according to claim 1, wherein a two-dimensional electron gas layer is formed at the interface of the heterojunction between said spacer with quantum well structure and a semiconductor layer adjacently contacted with said spacer layer, both of them being in the second layer.

6. A sensor according to claim1, wherein said semi-insulating semiconductor substrate consists of a non-doped GaAs layer.

7. A sensor according to claim 1, wherein said buffer layer consists of a non-doped GaAs layer.

8. A sensor according to claim 1, wherein said layer having the quantum well structure consists of a combination of a plurality of different kinds of semiconductor layers selected from the following combinations,
   AlAs/GaAs/AlAs,
   AlAs/GaAs/AlGaAs,
   AlGaAs/GaAs/AlGaAs,
   AlGaAs/GaAs/AlGaAs/GaAs/AlGaAs, and
   AlAs/GaAs/AlAs/GaAs/AlAs.

9. A sensor according to claim 1, wherein said carrier supply layer consists of an Si-doped AlGaAs layer.

10. A sensor according to claim 2, wherein said carrier supply layer having said superlattice structure consists of a combination of semiconductor layers of GaAs/n-GaAs/GaAs/AlAs.

11. A sensor which comprises,
    a substrate formed of a GaAs layer,
    a first layer as a buffer layer formed as a GaAs layer on said substrate,
    a second layer composed of a spacer layer and a carrier supply layer epitaxially-grown on said first layer, said spacer layer consisting of at least three different layers of AlAs/GaAs/AlGaAs or AlAs/GaAs/AlAs, accumulated in that order on a top surface of said first layer to form a quantum well structure and said carrier supply layer is formed as an Si-doped AlGaAs layer mounted on a top surface of said AlGaAs layer of the quantum well structure,
    a two-dimensional electron gas layer being formed between said GaAs layer in said first layer and said AlAs layer as the most bottom layer in the quantum well structure in said spacer layer and,
    a surface layer made of a doped or non-doped GaAs layer.

12. A sensor according to claim 11, wherein said carrier supply layer consists of another combination of different four layers of GaAs/n-GaAs/GaAs/AlAs, accumulated in this order on a top surface of said AlGaAs layer or AlAs layer of said quantum well structure to form a superlattice structure.

13. A sensor according to claim 11, wherein said quantum well structure consists of another combination of different layers of AlGaAs/GaAs/AlGaAs/GaAs/AlGaAs or AlAs/GaAs/AlAs/GaAs/AlAs, to form two quantum well structures.

14. A sensor according to claim 10 or 12, wherein said carrier supply layer is formed of by stacking a plurality of the unit combination of layers of GaAs/n-GaAs/GaAs/AlAs.

* * * * *